United States Patent [19]
Aronowitz et al.

[11] Patent Number: 5,877,530
[45] Date of Patent: Mar. 2, 1999

[54] FORMATION OF GRADIENT DOPED PROFILE REGION BETWEEN CHANNEL REGION AND HEAVILY DOPED SOURCE/ DRAIN CONTACT REGION OF MOS DEVICE IN INTEGRATED CIRCUIT STRUCTURE USING A RE-ENTRANT GATE ELECTRODE AND A HIGHER DOSE DRAIN IMPLANTATION

[75] Inventors: Sheldon Aronowitz, San Jose; Laique Khan, Milpitas; Philippe Schoenborn, San Jose, all of Calif.

[73] Assignee: LSI Logic Corporation, Milpitas, Calif.

[21] Appl. No.: 690,592

[22] Filed: Jul. 31, 1996

[51] Int. Cl.$^6$ ................................................. H01L 29/78
[52] U.S. Cl. ........................................ 257/344; 257/408
[58] Field of Search .................................. 257/344, 346, 257/408

[56] References Cited

U.S. PATENT DOCUMENTS

| | | | |
|---|---|---|---|
| 4,755,479 | 7/1988 | Miura | 257/344 |
| 5,021,851 | 6/1991 | Haken et al. | 257/346 |
| 5,554,544 | 9/1996 | Hsu | 257/344 |
| 5,719,425 | 2/1998 | Akram et al. | 257/344 |

FOREIGN PATENT DOCUMENTS

| | | | |
|---|---|---|---|
| 2-45935 | 2/1990 | Japan | 257/344 |
| 6-132299 | 5/1994 | Japan | 257/344 |

*Primary Examiner*—Gene M. Munson
*Attorney, Agent, or Firm*—John P. Taylor

[57] ABSTRACT

A novel integrated circuit structure, and process for making same, is disclosed wherein a tapered or gradient doped profile region is provided in a semiconductor substrate between the heavily doped drain region and the channel region in the substrate comprising an MOS device. In the process of the invention, a re-entrant or tapered gate electrode, resembling an inverted trapezoid, is used as a mask during a first doping step at a dosage level higher than normally used to form a conventional LDD region. This doping step forms a doped region having a dopant gradient which gradually increases in dosage level with distance from the channel region. Conventional oxide spacers may then be formed on the sidewalls of the gate electrode followed by conventional high level doping to form the heavily doped source and drain region in the unmasked portions of the substrate between the oxide spacers and the field oxide isolation. Since the doped region beneath the oxide spacers includes a gradient doped profile region, with the lightest level of dopant adjacent the channel region (since more of the tapered gate electrode acted as a mask for the initial implantation), the overall dosage level used in the first implantation step to form the gradient doped profile region may be higher than the dosage level conventionally used to form a conventional LDD region. The resistance of the path between the heavily doped drain contact region and the channel region, which includes the gradient doped profile region, is therefore lower than the resistance of a conventional LDD region.

10 Claims, 4 Drawing Sheets

FORMATION OF GRADIENT DOPED PROFILE REGION BETWEEN CHANNEL REGION AND HEAVILY DOPED SOURCE/ DRAIN CONTACT REGION OF MOS DEVICE IN INTEGRATED CIRCUIT STRUCTURE USING A RE-ENTRANT GATE ELECTRODE AND A HIGHER DOSE DRAIN IMPLANTATION

BACKGROUND OF THE INVENTION

1. Field of the Invention

This invention relates to the formation of a gradient doped profile region for an integrated circuit structure. More particularly, this invention relates to the formation of a gradient doped profile region of an integrated circuit structure between a heavily doped source/drain region and a channel region of an MOS device using a high dose drain implant and a retrograde gate electrode as a mask.

2. Description of the Related Art

In the construction of an MOS device in an integrated circuit structure formed in a semiconductor substrate, high strength electric fields are created or generated at the interface or junction between the heavily doped drain region and the channel region in the substrate beneath the gate electrode. Such high strength electric fields, in turn, cause the formation of hot carriers which are directed toward the gate electrode and the underlying gate oxide, resulting in damage to the fragile gate oxide which is very thin, i.e., only about 40–100 Angstroms thick.

This problem is very well known and has resulted in the widely practiced remedy of forming a lightly doped drain (LDD) region between the heavily doped drain region and the channel region in the semiconductor substrate. This LDD region provides a transition between the heavily doped drain region and the channel region to thereby lower the strength of the electric field generated adjacent the channel region and the gate oxide thereon, which, in turn, lowers the flux of hot carriers generated by the electric field.

This prior art approach of forming LDD regions is illustrated in FIG. 1 wherein a semiconductor substrate 2 is shown having a gate electrode 4 formed over a gate oxide 6 on the surface of substrate 2 with field oxide isolation portions 8 formed in the substrate laterally spaced from gate electrode 4 to allow source/drain regions to be formed in substrate 2 between gate electrode 4 and field oxide isolation 8. Before implanting substrate 2 to form the source/drain regions, the substrate is blanket implanted to lightly dope substrate 2, for example, with boron at a dosage of about $5 \times 10^{13}$ boron atoms/cm$^2$ to provide a P–region in an N well of a semiconductor substrate; or with arsenic (or phosphorus) at a dosage of about $5 \times 10^{13}$ atoms of arsenic/cm$^2$ (or $2 \times 10^{14}$ atoms of arsenic/cm$^2$) to provide an N–region in a P doped semiconductor substrate or a P well in a semiconductor substrate. This doping step then forms conventionally doped LDD regions 10 and 12 in the substrate, respectively, on either side of channel region 18 formed in substrate 2 beneath gate electrode 4 and gate oxide 6. A layer of oxide is then deposited over the entire structure and the oxide layer is then anisotropically etched, resulting in the formation of oxide spacers 20 on the sidewalls of gate electrode 4 which cover LDD portions 10 and 12 of the lightly-doped substrate immediately adjacent channel region 18. A conventional source/drain implant of the exposed portions of substrate 2 in between oxide spacers 20 and field oxide isolation 8 is then carried out resulting in the formation of conventional heavily doped (N+ or P+) source/drain regions 14 and 16. However, source/drain regions 14 and 16 are respectively separated from channel region 18 beneath gate electrode 4 by lightly doped LDD regions 10 and 12, which effectively solves the hot carrier problem and resulting degeneration of gate oxide 6.

However, it will be seen that the current flow passing between the source/drain region 14 and source/drain region 16 through channel 18 must also pass through LDD regions 10 and 12. Since LDD regions 10 and 12 constitute lightly doped regions of the semiconductor substrate, the resistance of these LDD regions is higher (because the lighter dopant level of the LDD regions results in the semiconductor substrate being a poorer electrical conductor through these regions). Such higher resistance introduced in the current path between the source and drain regions degrades the performance of the resulting MOS device, particularly at low voltages, e.g., voltages of as low as 2–3 volts. Since the use of lower voltages has become of particular importance for integrated circuit devices used in portable computers, such degraded performance of the LDD-containing MOS transistor at low voltage is generally becoming unacceptable.

It would, therefore, be desirable if the problems of high strength field generation and resultant hot carrier generation adjacent the junction between the channel region and the heavily doped drain region in the substrate could be solved without creating the conventional high resistance LDD region therebetween.

SUMMARY OF THE INVENTION

The invention comprises a novel integrated circuit structure, and process for making same, wherein a tapered or gradient doped profile region is provided in a semiconductor substrate between the heavily doped drain region and the channel region in the substrate of an MOS device. In the process of the invention, a re-entrant or tapered gate electrode is used as a mask during a first doping step at a dosage level higher than normally used to form a LDD region. This doping step forms a gradient doped profile region which gradually increases in dosage level with distance from the channel region. Conventional oxide spacers may then be formed on the sidewalls of the gate electrode followed by conventional high level doping to form the heavily doped source and drain region in the unmasked portions of the substrate between the oxide spacers and the field oxide isolation. Since the doped region beneath the oxide spacers includes a gradient doped profile region,, with the lightest level of dopant adjacent the channel region (since more of the tapered gate electrode acted as a mask for the initial implantation), the overall dosage level used in the first implantation step to form the dopant gradient may be higher than the low dosage level conventionally used to form an LDD region, e.g., a dosage level which will result in an N doping level rather than an N– doping level beneath the oxide spacer. The resistance of the path between the heavily doped N+ source/drain contact region and the channel region (which includes the gradient doped region) is, therefore, lower than the resistance of a conventional LDD region.

DETAILED DESCRIPTION OF THE INVENTION

In accordance with the invention, a novel integrated circuit structure is provided wherein a tapered or gradient doped profile region is constructed in an MOS device between the heavily doped drain region and the channel region of the substrate. The process comprises using a re-entrant or tapered gate electrode, resembling an inverted trapezoid, as a mask during a first doping step at a dosage level higher than normally used to form a conventional LDD region, whereby a doped region is formed in the substrate having a dopant gradient which gradually increases in dosage level with distance from the channel region due to the tapered gate electrode mask. Conventional oxide spacers may then be formed on the sidewalls of the gate electrode followed by conventional high level doping to form the heavily doped source and drain region in the unmasked portions of the substrate between the oxide spacers and the field oxide isolation. The term "conventional LDD region", as used herein, is intended to define a region in a semiconductor substrate implanted at a dosage level of about $5 \times 10^{13}$ atoms of dopant, typically boron, phosphorus, or arsenic, depending upon whether P– type LDD regions or N– type LDD regions are being formed.

The Re-Entrant Gate Electrode and Resulting Gradient Doped Profile Region

The terms "re-entrant gate electrode" or "tapered gate electrode" are intended to define a gate electrode wherein the sidewalls of the gate electrode have a taper, with respect to the vertical axis of the gate electrode, with the narrow portion of the gate electrode adjacent the substrate, i.e., in contact with the underlying gate oxide.

Such a re-entrant gate electrode, capable of functioning as a mask during implantation of the substrate adjacent the channel region of the MOS device being formed in the substrate, can be made in accordance with the process described and claimed in copending U.S. Pat. application Ser. No. 08/690,577, entitled "RE-ENTRANT GEOMETRY FOR GATE ELECTRODE OF INTEGRATED CIRCUIT STRUCTURE, AND PROCESS FOR FORMING SAME", filed Jul. 31, 1996 and assigned to the assignee of this invention, and the description of which is incorporated herein by reference.

Figure 1:
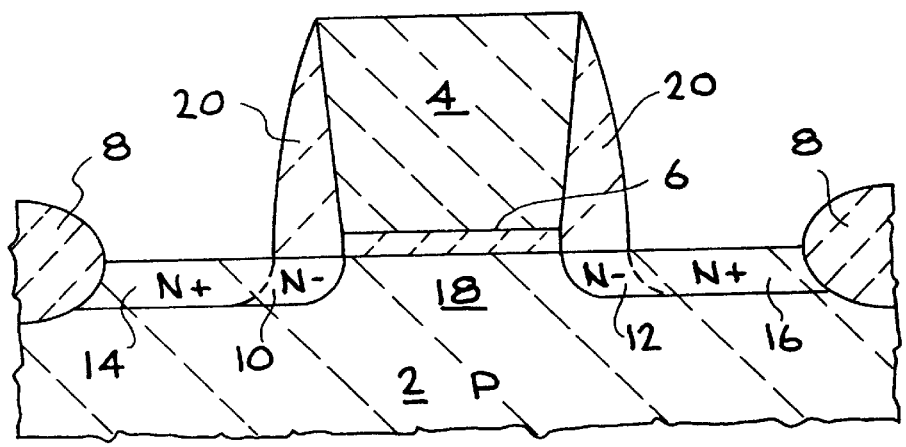
FIG. 1 is a fragmentary vertical side section view of a typical prior art MOS device having conventional LDD regions formed in the substrate below the oxide spacers between the heavily doped source/drain regions and the channel region below the gate electrode in the substrate.
Figure 2:
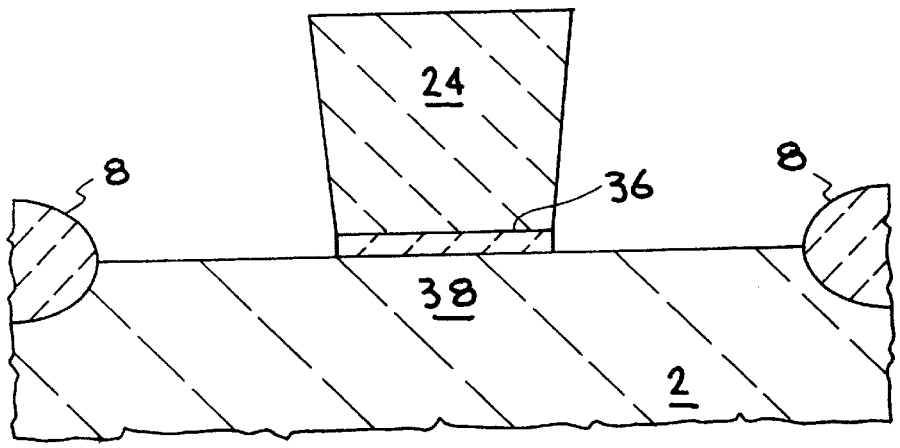
FIG. 2 is a fragmentary vertical side section view of a substrate having a re-entrant or taper gate electrode formed over the substrate.
Figure 3:
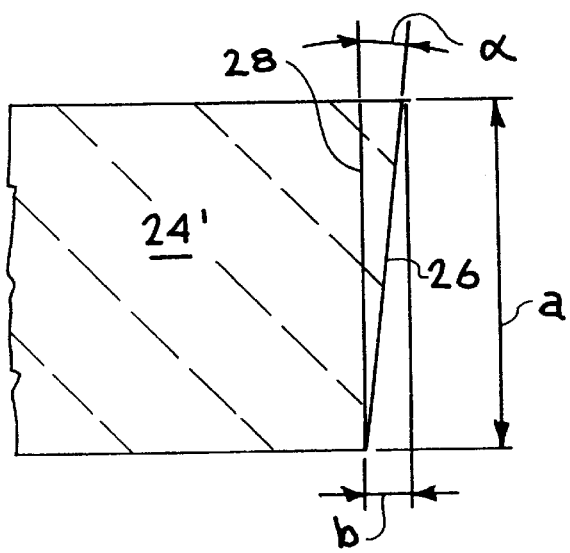
FIG. 3 is a fragmentary view of an enlargement of a tapered segment or portion of the structure of FIG. 2 showing the degree of taper of one of the side walls of the gate electrode.

Referring now to FIGS. 2 and 3, re-entrant or tapered gate electrode 24 and underlying gate oxide 36 are illustrated as formed on substrate 2 to provide the desired tapered mask for the practice of the invention. It will be noted that tapered sidewall 26 of gate electrode 24 slants inwardly as the bottom of tapered sidewall 26 approaches the surface of substrate 2, defining a mask structure resembling an inverted trapezoid, as best seen in FIG. 2. As shown in FIG. 3, angle $\alpha$ defines the angle between tapered sidewall 26 of re-entrant gate electrode portion 24' of re-entrant gate electrode 24 and a line perpendicular to the surface of substrate 2, such as line 28 shown in FIG. 3.

Examination of FIGS. 3 and 4 reveals that a subsequent implantation of dopant in a direction normal to the surface of substrate 2, i.e., parallel to line 28 of gate electrode 24, will result in a gradient of doping concentration in region 30 of substrate 2 below gate electrode mask as defined by width b in FIG. 3. That is, the implanted dopant atoms beneath the left side of width b of gate electrode mask portion 24' shown in FIG. 3 will encounter a greater thickness of gate electrode 24, resulting in a low concentration of dopant reaching region 30 in substrate 2 below the left side of the width b of the portion of mask portion 24' shown in FIG. 3, while the atoms from the implanter will encounter the smallest thickness of gate electrode 24 adjacent the right side of width b of the portion of mask portion 24' shown in FIG. 3, resulting in the highest concentration of implanted dopant across width b of gradient doped profile region 30 formed in substrate 2 adjacent channel region 38 beneath gate oxide 36. The remainder of substrate doped in this first doping step is designated as 32 in FIG. 4, and region 32 is designated as N doped to distinguish it from a lightly doped (LDD) region which would be designated as N– doped (or P– doped).

The amount or degree of the taper of gate electrode 24, i.e., the range of angle $\alpha$, will be controlled not only by the amount and total width of the desired dopant gradient in substrate 2, i.e., the "gradient doped profile region" (when gate electrode 24 is acting as a mask), but also by the desired ultimate performance or function of gate electrode 24 as a gate electrode for an MOS device or devices. In other words, while angle $\alpha$ must define some minimum amount to obtain the desired dopant gradient in the substrate, angle $\alpha$ must also be limited by a maximum amount so that the width of gate electrode 24 and underlying gate oxide 36 in contact with substrate 2 will still define a gate electrode wide enough to be capable of carrying the desired amount of current for proper function of the intended MOS device to be constructed.

Therefore, in accordance with the invention, gate electrode 24 should have a taper, with respect to the vertical axis of the gate electrode (defined and depicted in FIG. 3 as angle $\alpha$), of from about 520 to about 30°, preferably from about 5° to about 10°, and typically about 6°. Thus, for example, when, as shown in FIG. 3, the thickness or height a of gate electrode 24 (the length of line 28) is about 350 nanometers (nm), and angle $\alpha$ is about 6°, the width b of the gradient doped profile region to be formed in substrate 2 will be about 35 nm.

Figure 4:
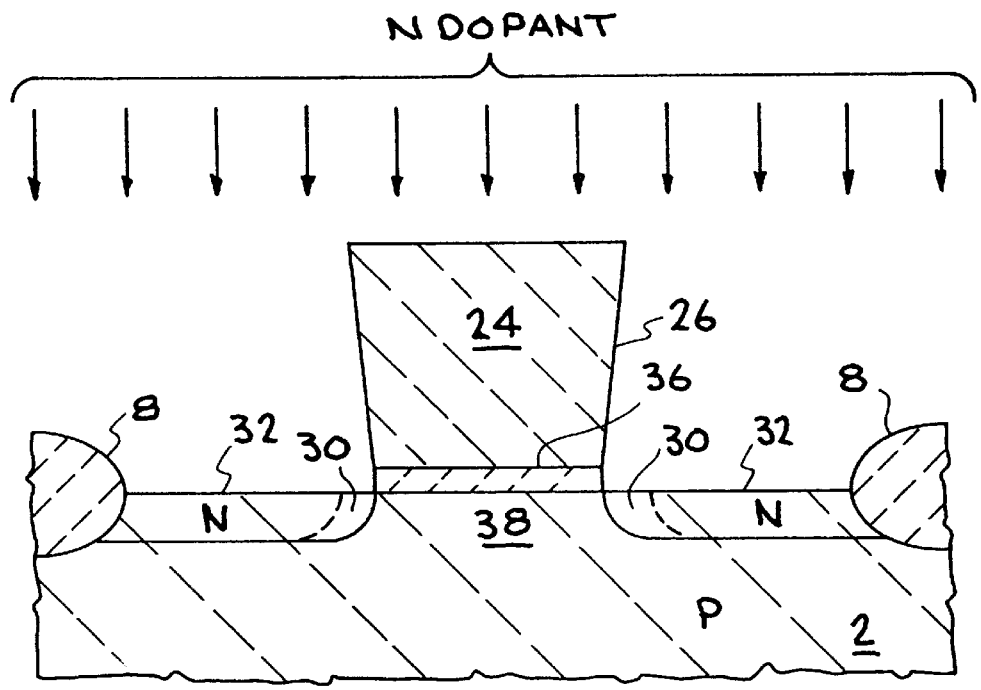
FIG. 4 is a fragmentary vertical side section view similar to FIG. 2, but showing the structure being implanted to form the tapered dopant gradient region in the substrate below the tapered portion of the gate electrode.

As shown in FIG. 4, after the formation of tapered gate electrode 24 on substrate 2, the entire structure is subjected to a blanket anisotropic implantation of an appropriate dopant, depending upon whether or not N or P regions are to be formed in the semiconductor substrate.

Figure 6:
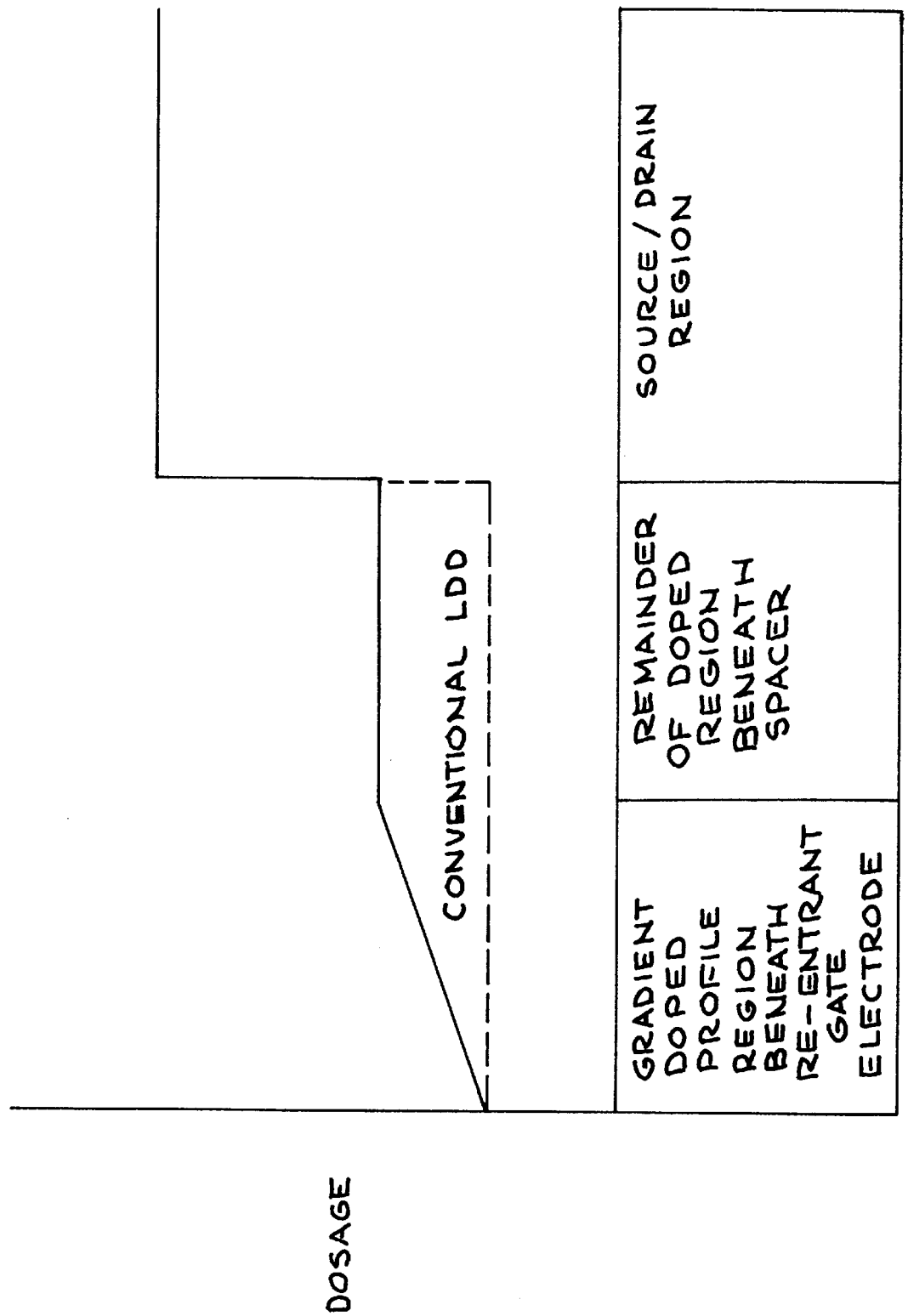
FIG. 6 is a graph showing the relative doping levels, respectively, beneath the re-entrant gate electrode, beneath the remainder of the oxide spacer, and the conventional source/drain doping level, in comparison to the conventional LDD doping level.

As also shown in FIG. 4, the dosage of dopant used to form both doped region 32 and adjoining doped region 30 having a dopant gradient in substrate 2 and also adjoining channel region 38 will, in accordance with a preferred embodiment of the invention, be greater than the N− level or dosage conventionally used to form the prior art LDD regions, due to the attenuation of the dosage level by the tapered sidewall 26 of gate electrode 24. In a particularly preferred embodiment, the dosage level used will be sufficient to permit formation of a doped region having a dopant level immediately adjacent channel region 38 approximately equal to that of a prior art LDD region. This can be seen on the left side of the graph of FIG. 6, which will be further discussed below. It will be readily appreciated, with respect to FIG. 4, that for the implantation to pass a sufficient amount of implanted atoms through the thickest portion of the taper of gate electrode 24, the dosage level will have to be considerably higher than that used to form the conventional LDD regions. This, in turn, means that the dopant level underlying the thinnest portion of the tapered gate electrode mask, i.e., the amount of dopant implanted into the substrate the farthest to the right of width b shown in FIG. 3, will have a dopant concentration much higher than that of a conventional LDD region, i.e., ranging from about 5 to about 50 times greater. This, as will be further discussed below, has a beneficial effect on the overall resistance path of the gradient been channel portion 38 and the heavily doped source/drain regions yet to be formed. It should also be noted, in this regard, that the entire unmasked region of substrate 2 between field oxide isolation 8 and the region defined by width b is also doped to this higher level of dopant concentration.

Thus, the term "gradient doped profile region", as used herein, is therefore, intended to define a doped region in a semiconductor substrate between a channel region and a heavily doped source/drain region of an MOS device wherein the level of the dosage actually reaching the substrate through the tapered mask adjacent the channel region is at least as great as the dosage level normally used to form a conventional LDD region; while the dosage level of the dopant applied to the substrate adjacent the region where the heavily doped source/drain region will be formed is greater than the dosage level normally implanted in the substrate when forming an LDD region. The dosage level implanted in the substrate in those regions not masked by gate electrode 24 will be generally an order of magnitude greater than the dosage used to form the conventional N− region (the conventional LDD region).

Further Processing of the Integrated Circuit Structure After Forming the Gradient Doped Profile Region After the blanket implantation of FIG. 4 to form the gradient doped profile region beneath the tapered portion of the gate electrode mask and adjacent the channel region in the substrate, an oxide layer is formed over the entire structure and this oxide layer is then anisotropically etched to form oxide spacers 40 on the tapered sidewalls 26 of gate electrode 24. This formation of oxide spacers 40 may be carried out in similar or identical manner to the prior art formation of oxide spacers on the sidewall of the gate electrode when LDD regions are formed in the substrate.

Figure 5:
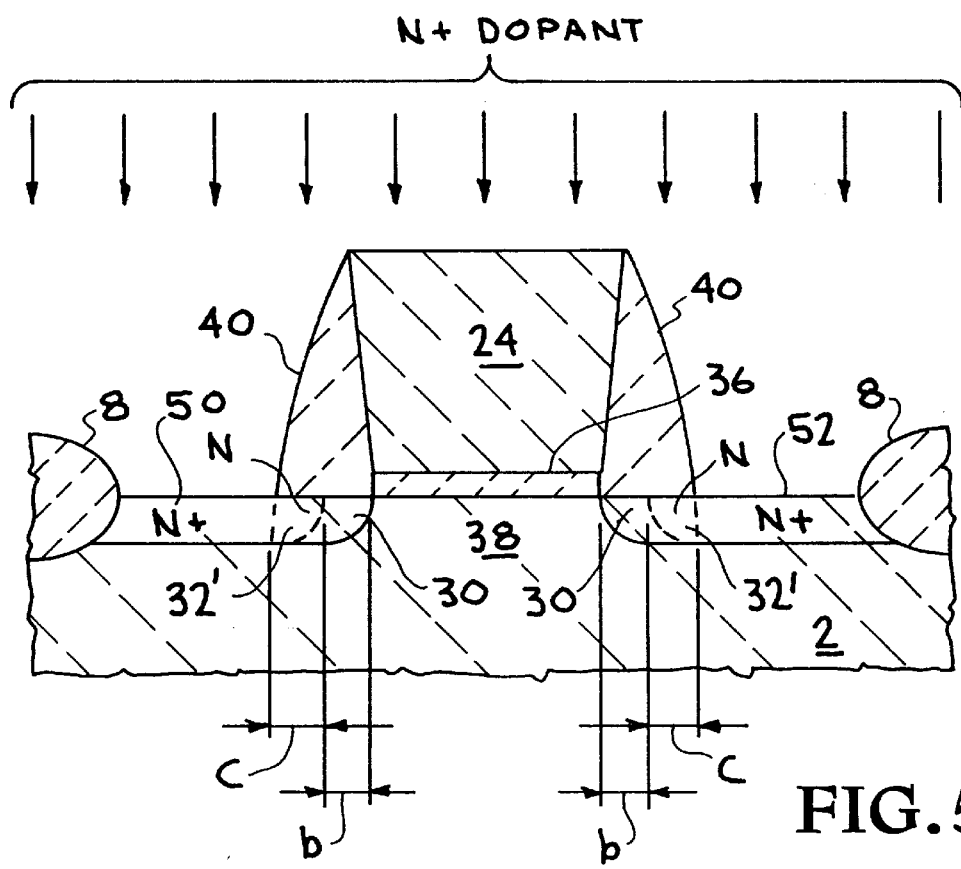
FIG. 5 is a fragmentary vertical side section view of the structure of FIG. 4 after the formation of sidewall spacer on the tapered sidewall of the gate electrode, and further showing the conventional implantation of the substrate to form the heavily doped source/drain regions in the unmasked portions of the substrate.

Oxide spacers 40 thus cover not only that portion of the substrate doped through gate electrode 24, i.e., the region defined by width b in FIG. 3, but also an additional portion of the previously doped substrate, due to the geometry of the oxide sidewall formed during the anisotropic etch of the oxide layer. This additional width is defined by width c next to width b in FIG. 5. Width c then represents the width of doped regions 32' beneath oxide spacer 40 having a dopant concentration therein equal to the maximum amount implanted during the first implantation, i.e., the level of dopant in regions 32 in FIG. 4 (since re-entrant gate electrode 24 did not cover these portions of substrate 2 during the first implantation).

After this formation of oxide spacers 40, the structure may be conventionally implanted, e.g., N+ implanted, to form heavily doped (N+ or P+) source/drain regions 50 and 52 in those portions of substrate 2 not covered by field oxide 8, gate electrode 24, and oxide spacers 40.

The result is heavily doped source/drain regions 50 and 52, each separated from channel region 38 by a doped region 32' beneath oxide spacer 40, and gradient doped profile region 30 (initially formed beneath gate electrode 24). Due to the dopant gradient in gradient doped profile region 30, the interface or junction between channel region 38 and gradient doped profile region 30, i.e., the junction closest to gate oxide layer 36, may have a dopant level approximating the prior art LDD dopant level (thus reducing the strength of the electric field at this point and thus suppressing the generation of hot carriers), yet most of the width b of the gradient doped profile region 30 and all of the width c of doped region 32' between channel region 38 and heavily doped source/drain regions 50 and 52 will have a higher dopant level than the prior art LDD region, thus resulting in lower resistance paths respectively between channel region 38 and source/drain regions 50 and 52. This is graphically illustrated in FIG. 6 which shows the relative dopant levels of gradient doped profile region 30, doped region 32', and heavily doped source/drain regions 50 and 52, in comparison to the dotted line representing the prior art LDD dopant level. Thus, it can be readily appreciated from this graph that the combined resistance path through regions 30 and 32' between the heavily doped source/drain region (50 or 52) and channel region 38 will be less than the resistance of the conventional LDD region.

Figure 7:
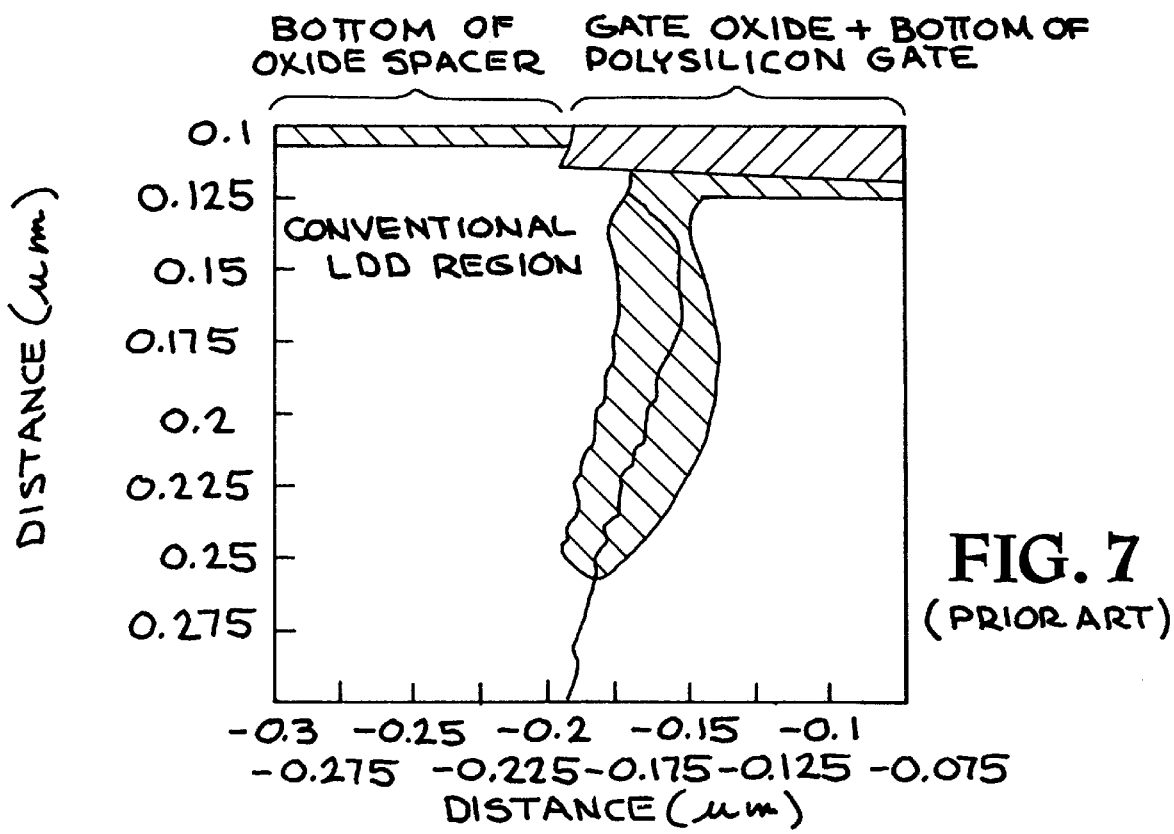
FIG. 7 is a graph showing an electric field simulation for a conventionally formed (prior art) MOS device with a conventional LDD region formed between the heavily doped source/drain region and the channel region of the MOS device.
Figure 8:
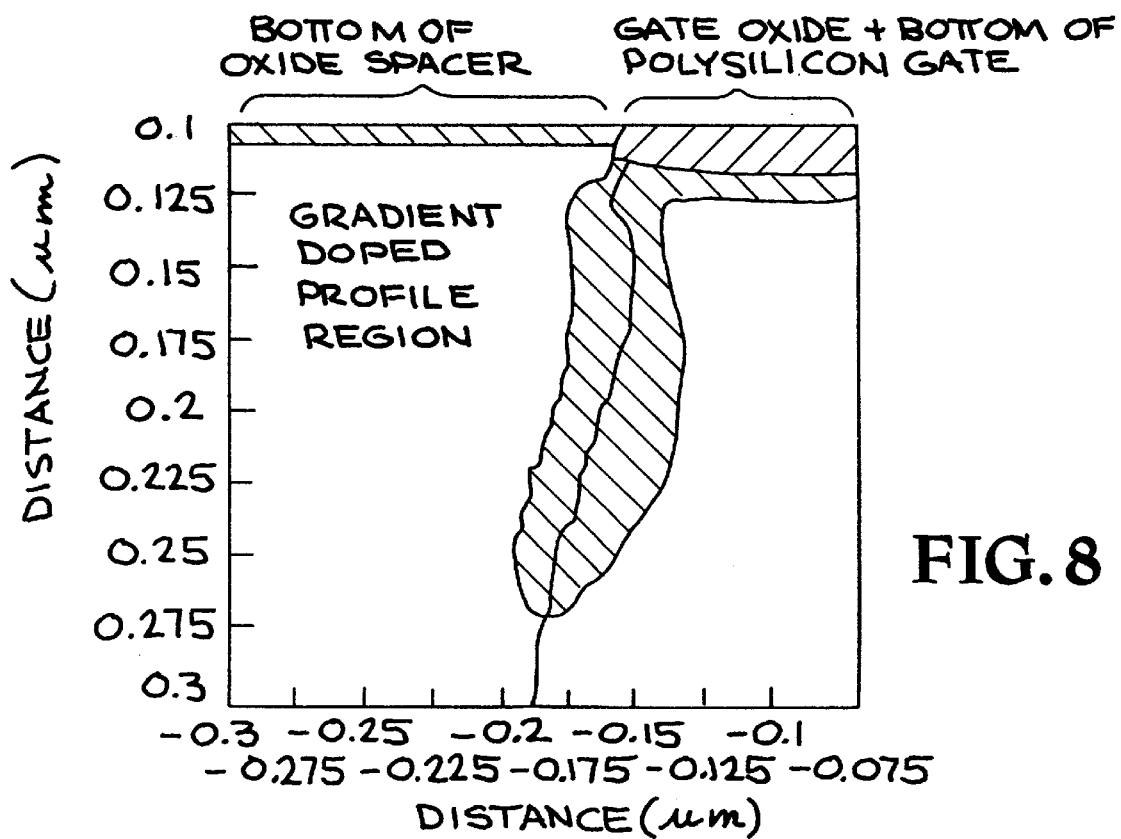
FIG. 8 is a graph showing an electric field simulation for an MOS device with a gradient doped profile region formed in accordance with the invention between the heavily doped source/drain region and the channel region of the MOS device.

Turning now to FIGS. 7 and 8, FIG. 7 comprises a graph showing an electric field simulation for a conventionally formed (prior art) MOS device with a conventional LDD region formed between the heavily doped source/drain region and the channel region of the MOS device; while FIG. 8 comprises a graph showing an electric field simulation for an MOS device with a gradient doped profile region formed in accordance with the invention between the heavily doped source/drain region and the channel region of the MOS device.

FIG. 7 displays the electric field simulation results when an LDD implantation is made with arsenic at a dosage of $2.0 \times 10^{14}$ atoms/cm$^2$ at 60 keV. The upper right-hand corner of the figure shows the gate oxide and bottom of the rectangular 400 nm gate, with the grey region in the substrate representing the highest values of the electric field. The doped drain region to the left of the shaded region, is a continuation of the LDD region, while the channel region is to the right of the shaded region. The maximum electric field equals about 6.1×105 volts/cm and is shown to occur around the drain junction, shown at 50, beneath the gate oxide. Hot carrier injection thus will be into the overlying gate oxide under the gate electrode.

In contrast, FIG. 8 shows the same structure (including the same implant dosage levels), but with the polysilicon gate electrode having a 6° taper with the bottom of the gate electrode, therefore, smaller (narrower) than the top of the gate electrode. The maximum field strength of the electric field in the drain region has been reduced to about $5.7 \times 10^5$ volts/cm, which reduction in field strength will lower the rate of hot carrier production by approximately a factor of 3. Moreover, it will be noted that the region of electric field generation has moved closer to the edge of the bottom portion of the gate and the gate oxide, so that any injection of hot carriers will occur at the edge of the bottom portion of the gate and gate oxide thereunder. Consequently, the effect of carrier injection into the oxide on the $V_t$ (threshold voltage) will be greatly reduced since the modification of the field will be at the fringe.

It should be noted that another simulation using the same structure, but with an increase in the N– dosage to $5.0 \times 10^{14}$ As atoms/cm², yielded a maximum field strength, at the drain region junction, of only 5.8×105 volts/cm, indicating that conventional LDD low dosage implants may be replaced by doping at a higher dosage during formation of the gradient doped profile region 30 and doped region 32' beneath the oxide spacer, resulting in a lower resistance path between the heavily doped source/drain regions and the channel region, as discussed above, without any substantial change in the maximum field strength adjacent the drain contact region.

Thus, the invention provides an improved MOS device for an integrated circuit structure wherein the region between the heavily doped source/drain region and the channel region beneath the gate electrode and the gate oxide is separated by a region at least a portion of which comprises a gradient doped profile region so that the portion of the gradient doped profile region adjacent the channel region has a dopant level at least as low as previous LDD regions, while the remainder of the region between the heavily doped source/drain region and the channel region is more heavily doped than the previous LDD region of the prior art. The result is an MOS device having reduced overlap capacitance, less area to inject hot carriers into the gate oxide, reduced field strength, and a lower resistance path between the heavily doped source/drain region and the channel region than previously available with a conventionally formed LDD region.

Having thus described the invention what is claimed is:

1. An integrated circuit structure comprising a metal-oxide-silicon (MOS) device comprising:
   a) a gradient doped profile region provided in a semiconductor substrate by implantation with a single dopant, said gradient doped profile region extending from a heavily doped source/drain region in said substrate to a channel region in said substrate beneath a gate electrode of said MOS device, with the portion of said gradient doped profile region adjacent said channel region having a dopant level of about $5 \times 10^{13}$ dopant atoms/cm² equivalent to that of a conventional lightly doped drain (LDD) region, with the remainder of said gradient doped profile region in said substrate having a dopant level gradually increasing from said dopant level equivalent to that of a conventional LDD region at said channel region up to a higher dopant level below the dopant level of said heavily doped source/drain region; and
   b) said gate electrode having a sidewall which is tapered inwardly at its base adjacent said substrate to thereby provide formation of said gradient doped profile region in said substrate beneath said tapered wall of said gate electrode when said substrate and said gate electrode are subject to an implantation by an ion beam perpendicular to said substrate.

2. The integrated circuit structure of claim 1 wherein said tapered sidewall of said gate electrode has a taper, with respect to the vertical axis of said gate electrode, ranging from about 5° to about 30°.

3. The integrated circuit structure of claim 1 wherein said tapered sidewall of said gate electrode has a taper, with respect to the vertical axis of said gate electrode, ranging from about 5° to about 10°.

4. The integrated circuit structure of claim 1 wherein oxide spacers are subsequently formed on said sidewall of said gate electrode after said implantation of said gate electrode and said substrate to form said gradient doped profile region in said substrate, but prior to formation of said heavily doped source/drain region, and the doped portion of said substrate beneath said oxide spacers is doped at a level less than that of said heavily doped source/drain region, but greater than a dopant level of about $5 \times 10^{13}$ dopant atoms/cm² equivalent to that of a conventional lightly doped drain (LDD) region, whereby the resistance of the path extending from said heavily doped source/drain region to said channel region through said doped portion beneath said oxide spacers and through said gradient doped profile region is less than the resistance through said conventional LDD region.

5. An integrated circuit structure comprising a metal-oxide-silicon (MOS) device in a semiconductor substrate doped by implantation with a single dopant to have a low resistance path formed by a gradient doped profile region extending from a heavily doped source/drain region in said substrate to a channel region in said substrate beneath a gate electrode of said MOS device comprising:
   a) a re-entrant gate electrode formed on said substrate over a gate oxide and a channel region formed in said substrate, said re-entrant gate electrode having an outward sidewall taper, with respect to the vertical axis of said gate electrode, ranging from about 5° to about 30°, whereby said taper provides a wider top of said gate electrode than its base;
   b) a doped source/drain contact region formed in said substrate spaced from said channel region; and
   c) a gradient doped profile region formed in said substrate and extending from said channel region to said doped source/drain region, said gradient doped profile region formed by implantation with a single dopant through said re-entrant gate electrode sidewall by an implantation beam perpendicular to said substrate, with the highest dopant level in said gradient doped profile region being adjacent said doped source/drain region, but less than that of said doped source/drain region, and with the lowest dopant level in said gradient profile doped region being adjacent said channel region and having a dopant level of about $5 \times 10^{13}$ dopant atoms/cm² equivalent to that of a conventional lightly doped drain (LDD) region, to inhibit generation of electric fields in said substrate adjacent said channel region.

6. The integrated circuit structure of claim 5 wherein the remainder of said gradient doped profile region not adjacent said channel region has a dopant level higher than that of said conventional LDD region to provide said low resistance path between said channel region and said source/drain contact region.

7. The integrated circuit structure of claim 5 wherein oxide spacers are formed on sidewalls of said gate electrode and the doped portion of said substrate beneath said oxide spacers is doped at a level less than that of said doped source/drain contact region and at a level equal to the highest doping level of said gradient doped profile region.

8. The integrated circuit structure of claim 5 wherein oxide spacers are present on sidewalls of said gate electrode and the doped portion of said substrate beneath said oxide spacers is doped at a level less than that of said doped source/drain contact region, but greater than said dopant level equivalent to that of said conventional LDD region, whereby the resistance of the path between said heavily doped source/drain region and said channel region through said doped portion beneath said oxide spacers and through said gradient doped profile is less than the resistance through said conventional LDD region.

9. An integrated circuit structure comprising a metal-oxide-silicon (MOS) device in a semiconductor substrate doped solely by implantation with a single dopant to have a low resistance path formed by a gradient doped profile region extending from a heavily doped source/drain region in said substrate to a channel region in said substrate beneath a gate electrode of said MOS device comprising:

a) a re-entrant gate electrode formed on said substrate over a gate oxide and a channel region formed in said substrate, said re-entrant gate electrode having an outward sidewall taper, with respect to the vertical axis of said gate electrode, ranging from about 5° to about 30°, and extending outwardly from a narrow bottom of said gate electrode adjacent said substrate to a wide top of said gate electrode;

b) a doped source/drain contact formed in said substrate spaced from said channel region; and c) a gradient doped profile region formed in said substrate and extending from said channel region to said doped source/drain region, said gradient doped profile region formed by implantation with a single dopant through said re-entrant gate electrode sidewall by an implantation beam perpendicular to said substrate, with the highest dopant level in said gradient doped profile region being adjacent said doped source/drain region and ranging from about 5 to 50 times greater than about $5\times10^{13}$ dopant atoms/cm$^2$, the dopant level of a conventional lightly doped drain (LDD) region, but less than that of said doped source/drain region, with the lowest dopant level in said gradient profile doped region being adjacent said channel region and having a dopant level of about $5\times10^{13}$ dopant atoms/cm$^2$ equivalent to that of said conventional LDD region, to inhibit generation of electric fields in said substrate adjacent said channel region.

10. The integrated circuit structure of claim 9 wherein oxide spacers are subsequently formed on said sidewall of said gate electrode after said implantation of said gate electrode and said substrate to form said gradient doped profile region in said substrate, but prior to formation of said heavily doped source/drain region, and the doped portion of said substrate beneath said oxide spacers is doped at a level less than that of said heavily doped source/drain region, but greater than a dopant level equivalent to that of said conventional LDD region, whereby the resistance of the path extending from said heavily doped source/drain region to said channel region through said doped portion beneath said oxide spacers and through said gradient doped profile region is less than the resistance through said conventional LDD region.

* * * * *